United States Patent [19]

Rosen et al.

[11] 4,028,204
[45] June 7, 1977

[54] PHOTOPOLYMERIZABLE COMPOUNDS AND COMPOSITIONS COMPRISING THE PRODUCT OF THE REACTION OF A RESIN AND A POLYCARBOXY-SUBSTITUTED BENZOPHENONE

[75] Inventors: George Rosen, Wayne; Daniel J. Carlick, Livingston; Ralph H. Reiter, Wayne, all of N.J.

[73] Assignee: Sun Chemical Corporation, New York, N.Y.

[22] Filed: May 12, 1975

[21] Appl. No.: 576,546

Related U.S. Application Data

[60] Division of Ser. No. 405,516, Oct. 11, 1973, Pat. No. 3,926,639, which is a continuation-in-part of Ser. No. 200,174, Nov. 18, 1971, abandoned.

[52] U.S. Cl. .......................... 204/159.14; 96/35.1; 96/84 R; 96/86 P; 96/87 R; 96/115 R; 96/115 P; 156/272; 204/159.15; 204/159.16; 204/159.19; 260/22 CQ; 260/22 T; 260/22 TN; 260/25; 260/50; 260/63 R; 260/65; 260/850; 260/859 R; 260/873; 427/44; 427/54; 427/43; 428/436; 428/501; 428/526; 428/530
[51] Int. Cl.² .................... C08F 8/00; C08G 19/00
[58] Field of Search ...................... 260/66, 63 UX; 204/159.19, 159.14; 96/115 P, 115 R; 427/44, 54

[56] References Cited

UNITED STATES PATENTS

| | | | |
|---|---|---|---|
| 3,108,085 | 10/1963 | Broadhead | 260/22 |
| 3,451,980 | 6/1969 | Brownstein | 260/78.5 |
| 3,926,639 | 12/1975 | Rosen et al. | 90/115 R |

*Primary Examiner*—Richard B. Turer
*Attorney, Agent, or Firm*—Cynthia Berlow

[57] ABSTRACT

Compounds containing a benzophenone or a substituted benzophenone moiety are (a) autophotopolymerizable, (b) photopolymerizable in compositions with another photoinitiator, and (c) photoinitiating in compositions with another photopolymerizable material.

8 Claims, No Drawings

PHOTOPOLYMERIZABLE COMPOUNDS AND COMPOSITIONS COMPRISING THE PRODUCT OF THE REACTION OF A RESIN AND A POLYCARBOXY-SUBSTITUTED BENZOPHENONE

This is a division of application Ser. No. 405,516, filed Oct. 11, 1973, (now U.S. Pat. No. 3,926,639), which is a continuation-in-part of application Ser. No. 200,174 (filed Nov. 18, 1971) now abandoned.

This invention relates to photopolymerizable compounds and compositions. More particularly it relates to compounds having built-in sensitizers which are autophotopolymerizable or which may be used as photoinitiators for photopolymerizable monomers.

The use of photopolymerizable ethylenically unsaturated monomeric materials in coating compositions, adhesives, printing inks, and the like is known. It is also known that such monomeric materials are converted into polymers by the action of radiation and that they will polymerize at an improved rate when exposed to radiation in the presence of a photoinitiator and/or a photosensitizer.

There are, however, a number of disadvantages connected with the use of added photoinitiators or photosensitizers along with the monomer in a photopolymerizable system. In the first place, photoinitiators must be activatable by radiation, such as ultraviolet light, electron beam radiation, or gamma radiation. At the same time they must be inactive at ambient temperatures in order to secure the storage and handling stability of the compositions containing them. In addition, the photoinitiator must be compatible with the monomer and the other ingredients, if any, in the system; for example, the initiator may have only a limited solubility in the selected monomer, thus decreasing the speed of the photopolymerization which to some extent is proportional to the concentration of the initiator in the system. It is also possible for the presence of an initiator to limit the use of other additives in the composition, thus preventing the attaining of the physical properties required for optimum performance in the desired end use.

The photoinitiator can form undesirable by-products which are not bonded to the product polymer; the photosensitizer usually does not end up as part of the polymer chain. As a result, a product may be formed which, at least in part, may be leachable by solvents.

In addition, many photoinitiators are crystalline and precipitate on standing. Also, with the use of added photoinitiators there may exist problems of uniform dispersion, volatility, and migration of the initiating material.

It has now been found that certain compounds autopolymerize and copolymerize upon exposure to a source of radiation, that is, they photopolymerize in the absence of a photoinitiator at a rate comparable to, or in some cases better than, the speed of previously disclosed monomers in the presence of a photoinitiator.

Inks and coatings made from these materials are free of volatile solvents, hydrophobic, and dry almost instantaneously in air at ambient temperature when exposed to a source of radiation, thus eliminating the need for ovens and the need to work in an oxygen-free environment as well as avoiding the air pollution, fire hazards, odor, and so forth that accompany the use of systems based on volatile solvents. The inks have excellent workability on offset printing presses. They form extremely hard and durable films on a wide variety of substrates, such as, for example, newsprint; coated paper stock, irregular, e.g., corrugated, board; metal, e.g., foils, meshes, cans, and bottle caps; woods; rubbers; polyesters, such as polyethylene terephthalate; glass; polyolefins, such as treated and untreated polyethylene and polypropylene; cellulose acetate; fabrics such as cotton, silk, and rayon; and the like. They exhibit no color change in the applied film when subjected to the required curing conditions, and they are resistant to flaking; smudging; salt spray; scuffing; rubbing; and the deteriorating effects of such substances as alcohols, oils and fats. The adhesives made with these materials have particularly good bonding properties. In addition, the compounds and compositions withstand both heat and cold, making them useful, for example, in printing inks or coatings for containers that must be sterilized, e.g., up to about 150° C. Under pressure, and/or refrigerated, e.g., at less than about −20° C; and so forth.

In general the compounds of this invention are resins containing a benzophenone or a substituted benzophenone moiety.

The novel compounds of this invention are prepared by reacting a resin with a suitable mono- or polycarboxy-substituted benzophenone.

Although the invention will be illustrated by use of compounds prepared from o-benzoylbenzoic acid (o-BBA), it is to be understood that this is for purposes of demonstration and that the invention is applicable also to other benzophenone carboxylic acids and anhydrides, such as o-(p-chlorobenzoyl) benzoic acid, o-(p-dimethylaminobenzoyl) benzoic acid, o-(p-diethylaminobenzoyl) benzoic acid, benzophenone dicarboxylic acids, benzophenone tricarboxylic acids, benzophenone tetracarboxylic acids, benzophenone pentacarboxylic acids, and benzophenone hexacarboxylic acids; the corresponding anhydrides; and substituted benzophenone mono- and polycarboxylic acids and anhydrides having the following formula:

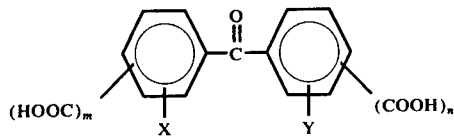

wherein $m$ and $n$ is each an integer of 0 to 3 and the sum of $m$ and $n$ is in the range of 1 to 6; and X and Y may each be 1 to 4 halogen atoms, e.g., chlorine, bromine, or iodine; dialkylamino groups having 1 to 4 carbon atoms; or other groups which confer desirable properties to the product, such as for example alkyl, aryl, nitro, amide, amine, ester, peroxy, hydroxy, alkoxy, aldehyde, ketone, and the like, groups; X and Y may be the same or different and either or both may be omitted. Such acids and anhydrides are known in the art and may be obtained commercially or prepared by any known and convenient method.

In accordance with this invention, carboxy-substituted benzophenones are reacted with resins, such as for example alkyds, polyesters, polyethers, polyamides, carbamates, epoxies, and so forth. These resinous derivatives have built-in sensitizers and are useful per se for coatings, inks, adhesives, and the like, or may be used in a variety of applications in combination with drying oils, alkyd resins, vinyl resins, monomeric polyfunctional esters, modified monomeric polyfunctional esters, etc., with or without a secondary initiator.

Alkyd resins may be prepared by reacting a carboxy-substituted benzophenone with, for example, a glycol or a higher polyol with or without other acids or anhydrides, such as phthalic anhydride, isomeric phthalic acids, etc. These alkyds may be modified, for example with oils such as linseed, safflower, or tung or with an isocyanate, such as tolylene diisocyanate.

Polyamides may be prepared by reacting a carboxy-substituted benzophenone with, for example a short chain diamine or other polyamine and other dicarboxylic acids such as dimer fatty acids (dimers of linoleic acid).

Saturated and unsaturated polyesters may be prepared by reacting a carboxy-substituted benzophenone with, for example, a polyol such as a glycol or pentaerythritol and maleic or fumaric acid with or without drying oils and acids such as coconut oil and lauric acid.

Copolymers of the compounds of this invention with ethylenically unsaturated monomers are likewise within the scope of this invention. Examples of such comonomers include styrene, alpha-methyl stryene, acrylic and methacrylic acids, acrylates and methacrylates, acrylamides, acrylonitrile, dibutyl maleate, dibutyl fumarate, diallyl phthalate, vinyl acetate, vinyl chloride, vinyl fluoride, ethylene, propylene, butadiene, isoprene, and the like, and their mixtures. These copolymers generally contain from about 0.1 to 50 weight percent of the carboxy-substituted benzophenone derivatives described above.

The photocuring speed of the reaction is influenced by the amount of the benzophenone or substituted benzophenone moiety in the product. For the purposes of this invention, the amount of the moiety is in general about 5 to 50, and preferably equivalent to about 15 to 40, percent by weight of the product.

These products having a built-in sensitizer may be prepared in any known and convenient manner, such as for example by reacting the resin with the carboxy-substituted benzophenone in an amount whereby the equivalents of the acid or anhydride are roughly equal to the equivalents of the reactive groups of the compound with which the carboxy-substituted benzophenone is reacted at a temperature of about 50° to 150° C., and preferably about 70° to 110° C., although these conditions are not critical. In general the molar ratio of the reactive groups of the resin to the acid or anhydride is in the range of about 1:1 to about 5:1.

While the novel products of this invention may photopolymerize at satisfactory rates in the absence of photoinitiating additives, their photocuring rates can be increased by the addition thereto of another photoinitiator. Examples of suitable photoinitiators include the following; acyloins; such as benzoin, acyloin derivatives, such as benzoin methyl ether, benzoin ethyl ether, desyl bromide, desyl chloride, desyl amine, and the like; ketones, such as benzophenone, acetophenone, ethyl methyl ketone, cyclopentanone, benzil, caprone, benzoyl cyclobutanone, dioctyl acetone, and the like; substituted benzophenones such as Michler's ketone; quinones and polynuclear quinones, such as naphthaquinone and anthraquinone; substituted polynuclear quinones; halogenated aliphatic, alicyclic, and aromatic hydrocarbons and their mixtures in which the halogen may be chlorine, bromine, fluorine, or iodine; and the like; and mixtures thereof. Examples of halogenated photoinitiators include polyhalogenated hydrocarbons, such as polyfluorinated phenyls (E.I. duPont de Nemours & Co.); chlorinated rubbers, such as the Parlons (Hercules Powder Company); copolymers of vinyl chloride and vinyl isobutyl ether, such as Vinoflex MP-400 (BASF Colors and Chemicals, Inc.); chlorinated aliphatic waxes, such as Chlorowax 70 (Diamond Alkali, Inc.); perchloropentacyclodecane, such as Dechlorane+ (Hooker Chemical Co.); chlorinated paraffins, such as Chlorafin 40 (Hooker Chemical Co.) and Unichlor-70B (Neville Chemical Co.); mono- and polychlorobenzenes; mono- and polybromobenzenes; mono- and polychloroxylenes; mono- and polybroxylenes; dichloromaleic anhydride; 1-(chloro-2-methyl) naphthalene; 2, 4-dimethylbenzene sulfonyl chloride; 1-bromo-3-(m-phenoxy henoxy benzene); 2-bromoethyl methyl ether; chlorendic anhydride; chloromethylnaphthyl chloride; chloromethyl naphthalene; bromomethyl phenanthrene; diiodomethyl anthracene; hexachlorocyclopentadiene; hexachlorobenzene; and the like; and mixtures thereof. When a photoinitiator is used, the ratio of the amount of the benzophenone derivative to the photoinitiator is generally about 99:1 to about 10:90 and preferably from about 30:70 to about 70:30.

In addition to being photopolymerizable in the absence or the presence of other photosensitizers, the novel compounds of this invention may themselves be used as photosensitizers, speeding up the curing rate of a variety of polyethylenically unsaturated esters, such as the reaction products of an ethylenically unsaturated acid, e.g., acrylic, methacrylic, or itaconic, with a polyhydric alcohol, e.g., ethylene glycol, trimethylolethane, trimethylolpropane, pentaerythritol, or sorbitol, modifications of these esters; and their mixtures. The compounds of this invention may be used alone as photosensitizers or they may be used along with at least one other photosensitizing additive. When used as photosensitizers, the compounds of this invention are used in a ratio to the polyethylenically unsaturated monomer of about 1:99 to about 90:10, and preferably from about 30:70 to about 70:30.

When used in combination with a second initiator or sensitizer, such as are listed above, about 0.1 to 10 parts by weight of the secondary initiator per 100 parts of the carboxy-substituted benzophenone derivative are used.

Commonly known modifiers may be incorporated into the formulations using these compounds and compositions, including plasticizers; wetting agents for the colorant, such as dichloromethylstearate and other chlorinated fatty esters; leveling agents, such as lanolin, paraffin waxes, and natural waxes; and the like. Such modifiers are generally used in amounts ranging up to about 3 percent by weight, and preferably about 1 percent, based on the total weight of the formulation. The formulations may be prepared in any convenient manner, such as, for example in a three-roll mill, a sand mill, a ball mill, a colloid mill, or the like, in accordance with known dispersion techniques.

Variables which determine the rate at which a radiation-curable compound or composition will dry include the nature of the substrate, the specific ingredients in the composition, the concentration of the photoinitiator, the thickness of the material, the nature and intensity of the radiation source and its distance from the material, the presence or absence of oxygen, and the temperature of the surrounding atmosphere and of the substrate. Irradiation may be accomplished by any one or a combination of a variety of methods. The composition may be exposed, for example, to actinic light from any source and of any type as long as it furnishes an effective amount of ultraviolet radiation, since the compositions activatable by actinic light generally exhibit their maximum sensitivity in the range of about 1800 A. to 4000 A., and preferably about 2000 A. to 3000 A.; electron beams; gamma radiation emitters; and the like; and combinations of these. Suitable sources include, but are not limited to, carbon arcs, mercury-vapor arcs, fluorescent lamps with special ultraviolet light-emitting phosphors, argon glow lamps, photographic flood lamps, and so forth.

The time of irradiation must be sufficient to give the effective dosage. Irradiation may be carried out at any convenient temperature, and most suitably is carried out at room temperature for practical reasons. Distances of the radiation source from the work may range from about ⅛ inch to 10 inches, and preferably about ⅛ inch to 6 inches.

The compounds and compositions of the present invention are suitable for use in the absence of volatile solvents and in the presence of oxygen as vehicles for paints, lacquers, and printing inks which are capable of setting or hardening by exposure to radiation. They are suitable also as compositions and elements for the preparation of photographic images, printing plates, and rolls; as adhesives for foils, films, papers, fabrics, and the like; as coatings for metals, plastics, paper, wood, foils, textiles, glass, cardboard, box board, and the like; as markers for roads, parking lots, airfields, and similar surfaces; and so forth.

When used as vehicles for inks, e.g., printing inks, the compound may be pigmented with any of a variety of conventional organic or inorganic pigments, e.g., molybdate orange, titanium white, chrome yellow, phthalocyanine blue, and carbon black, as well as colored with dyes in a conventional amount. For example, the vehicle may be used in an amount ranging from about 20 to 99.9 percent and the amount of colorant may range from about 0.1 to 80 percent of the weight of the total composition.

Stock which may be printed includes paper, clay-coated paper, and box board. In addition, the compositions of the present invention are suitable for treatment of textiles, both natural and synthetic, e.g., in vehicles for textile printing inks or for specialized treatments of fabrics to produce water repellency, oil and stain resistance, crease resistance, etc.

When the photopolymerizable materials of the present invention are used as adhesives, at least one of the substrates must be translucent or transparent when ultraviolet light is used. When the radiation source is an electron beam or gamma radiation, at least one of the substrates must be capable of transmitting high energy electrons or gamma radiation, respectively, and neither is necessarily translucent to light. Typical laminations include polymer-coated cellophane to polymer-coated cellophane films, polymer-coated cellophane to polypropylene, Mylar to a metal substance such as aluminum or copper, polypropylene to aluminum, and the like.

The photopolymerizable compounds of the present invention may be utilized for metal coatings and particularly for metals which are to be subsequently printed. Glass and plastics may also be printed or coated, and the coatings are conventionally applied by roller or spray. Pigmented coating systems may be used for various polyester and vinyl films; glass; polymer-coated cellophane; treated and untreated polyethylene, for example in the form of disposable cups or bottles; treates and untreated polypropylene; and the like. Examples of metal which may be coated include sized and unsized tin plate.

Photopolymerizable elements prepared from the materials of this invention comprise a support, e.g., a sheet or plate, having superimposed thereon a layer of the above-described radiation-curable material. Suitable base or support materials include metals, e.g., steel and aluminum plates; sheets; and foils; and films or plates composed of various film-forming synthetic resins or high polymers, such as additional polymers, and in particular vinyl polymers, e.g., vinyl chloride polymers; vinylidene chloride polymers; vinylidene chloride copolymers with vinyl chloride, vinyl acetate, or acrylonitrile; linear condensation polymers such as polyesters, e.g., polyethylene terephthalate; polyamides, etc. Fillers or reinforcing agents can be present in the synthetic resin or polymer bases. In addition, highly reflective bases may be treated to absorb ultraviolet light, or a light absorbtive layer can be transposed between the base and photopolymerizable layer.

Photopolymerizable elements can be made by exposing to radiation selected portions of the photopolymerizable layer thereof until addition polymerization is completed to the desired depth in the exposed portions. The unexposed portions of the layer are then removed, e.g., by the use of solvents which dissolve the monomer or prepolymer but not the polymer.

When a carboxy-substituted benzophenone-modified resin is mixed with a photosensitizer that absorbs in the visible spectrum, e.g., one of the acyloin type such as benzoin, a clear liquid composition results which may be cast into any thickness; upon exposure to actinic or ultraviolet radiation, the cast composition will cure to a solid plastic which is suitable for use as a structural material, to encapsulate electrical components, and the like.

Oil-free polyesters and polyurethane alkyds made from a carboxy-substituted benzophenone are well-suited for use as a plasticizers for aminoformaldehyde resins and vinyl resins. Isocyanate-terminated polyesters and polyethers containing the benzophenone or substituted benzophenone moiety are useful as foams and industrial coatings. Polyamide resins containing a built-in sensitizer are particularly useful in printing inks, coating compositions, and adhesives.

Polyesters prepared from a carboxy-substituted benzophenone and a 1,2-disubstituted ethylene such as maleic anhydride or furmaric acid can be dissolved in monomers such as styrene or methyl methacrylate and fortified with glass fibers to give a composition which, upon exposure to radiation, gives structural laminants suitable for boats, roofing materials, and the like.

The compounds and compositions as described herein possess many advantages over the conventional oleoresinous and solvet-type inks and coatings. The substrate need not be pretreated or prepared in any way. The use of volatile solvents and the attendant hazards and odor are eliminated. The inks and coatings have excellent adhesion to the substrate after exposure to radiation. They have good gloss and rub-resistance and withstand temperatures as high as about 150° C. and as low as about −20° C. The printed or coated sheets can be worked and turned immediately after exposure to the energy source.

The invention and its advantages will be better understood with reference to the following illustrative examples, but it is not intended to be limited thereto. In the examples, the parts are given by weight unless otherwise specified. Unless otherwise indicated, when the ingredient is solid at room temperature, the mixture may be heated to melt the solid ingredient, but generally not above 100° C., or it may be used in a mixture with other liquid ingredients. The atmospheric and temperature conditions were ambient unless otherwise noted.

EXAMPLE 1

A. A benzoylbenzoic acid-modified polyamide resin was prepared by heating 205.1 parts of dimer fatty acids with 68.1 parts of o-benzoyl-benzoic acid (o-BBA) at 140° C. 31.5 Parts of ethylene diamine was dropped into the mixture slowly, maintaining the exotherm by cooling at about 140°–150° C. After the addition of the dimer was complete, the resulting polymeric salt was dehydrated slowly by heating it to 200° C. The product was an amber-colored thermoplastic resin melting at 92° C. It was soluble in lower alcohols and was compatible with nitrocellulose.

B. A thin film of an alcohol solution of the polyamide of part (A) above was exposed to ultraviolet light and crosslinked to an insoluble adhesive coating in 3 seconds.

EXAMPLE 2

A. A non-drying alkyd resin was prepared by reacting the following ingredients at 200°–230° C. in 6% xylene as azeotrope over a period of 10 hours: 175 parts of pelargonic acid, 50 parts of o-benzoylbenzoic acid, 137 parts of phthalic anhydride, 2 parts of fumaric acid, and 135 parts of pentaerythritol. The product had an acid value of 5.5 and its viscosity in xylene was about 6–9 poises at 50%.

B. A 65/35 mixture of the alkyd resin of part (A) and an isocyanate-modified pentaerythrotol triacrylate (prepared by the process disclosed in U.S. Pat. No. 3,759,809, which issued on Sept. 18, 1973.) was coated onto tin-free steel and exposed to a 100-watt/inch ultraviolet lamp. A high quality crosslinked film was obtained in about 2.5 seconds.

EXAMPLE 3

A benzoylbenzoic acid-modified unsaturated polyester resin was prepared by heating to 390° F. under nitrogen the following ingredients: 73.5 parts of maleic anhydride, 137.9 parts of propylene glycol, 103.6 parts of phthalic anhydride, 90.8 parts of o-benzoylbenzoic acid, and 0.02 parts of hydroquinone. The reaction was continued at 385°–395° F. until the product had an acid value of 40–45 and a viscosity of 11 at 70% in styrene. The batch was then cooled to 290° F. and dropped into 186 parts of styrene monomer. The product contained 70% solids and had a Gardner viscosity of 11–15 poises. It dried in 2 seconds when exposed to ultraviolet light.

EXAMPLE 4

A benzoylbenzoic acid rosin-modified phenolic resin was prepared by heating 800 parts of WW rosin and 200 parts of o-benzoylbenzoic acid at 480° F. 200 Parts of liquid phenolformaldehyde resin was added slowly. At the completion of the addition, 105 parts of 95% glycerin was added and the mass heated slowly to 520° F. where it was held until an acid value of 14–20 was reached (about 4–6 hours).

The product was hard amber-colored resin melting at 310°–320° F. It was soluble in petroleum solvents and drying oils. Upon exposure to ultraviolet radiation the product dried in 3 seconds.

EXAMPLE 5

A. A benzoylbenzoic acid-polyurethane ester was prepared as follows: 30 parts of xylene, 425 parts of dipropylene glycol, and 120 parts of trimethylolethane were charged to a 3-liter resin flask equipped with a thermometer, stirrer, inert gas inlet tube, and heating mantle set up for Dean-Stark decantation of water of esterification. The mixture was heated to 75° C., and then 454 parts of o-benzoylbenzoic acid was added. Heating was continued under blanket of nitrogen to 150° C. until esterification commenced. After 5 hours the reaction temperature rose to 217° C. and 35.5 grams of water of reaction had been collected.

The acid value of the product was 3.8 mg KOH per gram of resin. At 200° C. and 20mm Hg vacuum the residual xylene was stripped from the reaction mixture.

The temperature of the reaction was lowered to 110° C., and 253 parts of an 80/20 mixture of the 2,4- and 2,6-isomers of toluene diisocyanate was added over a 1-hour period via a dropping funnel in order to maintain the exotherm temperature below 150° C. When all of the toluene diisocyanate had been added, the viscous reaction mixture was held at 150° C. until all free NCO was consumed as monitored by an infrared scan of a sample of the product at 4.45 $\mu$.

The product, a pale amber o-BBA-polyurethane ester, was discharged at 75°–100° C. It had a melting point in the range of 45°–54° C. as measured by the Durran mercury method. The resin was freely soluble in aromatic hydrocarbons, ketones, and esters.

B. A solution of 30 parts of the product of part (A) above in 70 parts of pentaerythritol tetraacrylate was applied in a thin film to corona-treated polyethylene film and laminated to vinylidene chloride-coated cellophane. The sample was exposed to a 200-watt/inch ultraviolet lamp for 0.2 seconds, causing complete cure of the adhesive and providing a laminate having excellent peel strength.

EXAMPLE 6

A benzophenone tetracarboxylic dianhydride (BTDA)-modified polyester was prepared by heating to 170° C. under nitrogen the following ingredients: 161 parts of BTDA, 200.4 parts of tridecanol, 256 parts of pelargonic acid, 137 parts of phthalic anhydride, and 29.6 parts of toluene. The reaction was continued at 207°–215° C. until the product had an acid value of 10.8 (about 12 hours). The product was an amber colored soft resin.

EXAMPLE 7

A BTDA-modified polyester was prepared by heating to 240° C. under nitrogen the following ingredients: 724 parts of a 2:1 mixture of BTDA and tridecanol, 107 parts of dipropylene glycol, 41.4 parts of trimethylolethane, and 20 parts of pelargonic acid. The reaction was continued until the product had an acid value of 13.5 (about 8 hours). The product was an amber colored, soft, tacky resin.

EXAMPLE 8

A BTDA-modified alkyd/polyester was prepared by heating to 220° C. under nitrogen the following ingredients: 161.5 parts of a 2:1 mixture of BTDA and tridecanol, 451 parts of dehydrated castor oil, 137 parts of trimethylolethane, and 29.6 parts of phthalic anhydride. Water of esterification was collected, and the reaction terminated when the product had an acid number of 9.2. The product was a dark amber, soft resin.

EXAMPLE 9

The procedures of Examples 1–8 were repeated with each of the following instead of o-BBA or BTDA: o-(p-chlorobenzoyl) benzoic acid, o-(p-dimethylaminobenzoyl) benzoic acid, 2,2'-benzophenone dicarboxylic acid, benzophenone tetracarboxylic acid, benzophenone hexacarboxylic dianhydride, diethylaminobenzophenone tetracarboxylic acid, and N,N'-dibutylaminobenzophenone tetracarboxylic acid. The results were comparable.

EXAMPLE 10

Several of the products of this invention were formulated into inks and tested as follows:

A. A mixture of 23 parts of o-BBA-modified oil-free alkyd resin, 59 parts of isocyanate-modified pentaerythritol triacrylate, 15 parts of phthalocyanone blue, and 3 parts of 4,4'-bis (dimethylamino)benzophenone was printed onto clay-coated sulfite board by web offset and was dried by passing it at the rate of 550 feet per minute on a sheet-fed lithographic press equipped with 2 reflectorized 200-watt/inch mercury vapor lamps.

B. A mixture of 50 parts of o-BBA-modified linseed oil-alkyd resin, 30 parts of isocyanate-modified pentaerythritol triacrylate, 15 parts of phthalocyanine blue, and 5 parts of 4,4'-bis (dimethylamino) benzophenone was printed onto clay-coated sulfite board and dried by passing it at the rate of 600 feet per minute on the equipment of part (A) above.

C. A mixture of 85 parts of o-BBA-polyurethane ester and 15 parts of phthalocyanine blue was printed onto coated paper by letterpress and dried by passing it under three 200-watt/inch mercury vapor lamps at the rate of 1200 feet per minute.

D. A mixture of 68 parts of o-BBA-rosin-modified phenolic resin, 15 parts of phthalocyanine blue, and 17 parts of Michler's ketone was printed by web offset onto 32-pound coated paper. The ink was dried by passing it under three 200-watt/inch mercury vapor lamps at a rate of 800 feet per minute.

E. A mixture of 90 parts of a BTDA-modified polyester prepared by the process of Example 6 and 10 parts of phthalocyanine blue was printed onto coated paper by letterpress and dried by passing it under three 200-watt/inch mercury vapor lamps at the rate of 1200 feet per minute.

F. The procedure of part (E) was repeated with each of the products of examples 7, 8, and 9 instead of the BTDA-modified polyester. The results were comparable.

G. The procedures of parts (A), (B) and (d) were repeated with each of the following photoinitiators instead of 4,4'-bis (dimethylamino) benzophenone (or Michler's ketone): benzoin methyl ether, acetophenonebenzil, and hexachlorobenzene. The results were comparable.

In each case the sheets were set off free without the use of spray powders and were scratch resistant.

EXAMPLE 11

The products of Examples 1 (A) and 2–9 were applied by offset gravure at film weights ranging from 0.5 to 3.0 pounds per ream to each of these substrates: Saran-coated cellophane, polyethylene surface-treated with corona discharge, polyvinylidene dichloride-coated polypropylene, and Mylar. Laminations were made at 150° F. and 50 pounds/inch pressure between cellophane and cellophane, cellophane and polyethylene, cellophane and polypropylene, and polypropylene and Mylar, and then cured by exposing them at the rate of 50 feet per minute at a distance of 1 inch from a 1200-watt/inch ultraviolet lamp. The laminations were successful as evidenced by tear seals having bond strengths of at least 300 grams per inch.

EXAMPLE 12

The procedures of Example 10 (parts A–G) were repeated with each of the following colorants instead of phthalocyanine blue: benzidine yellow, lithol rubine red, carbon black, milori blue, and phthalocyanine green. The results were comparable.

EXAMPLE 13

The procedures of Examples 1 (B), 2 (B), 3, 4, 5 (B), and 6–11 were repeated except that instead of being exposed to ultraviolet light the samples were passed on a conveyor belt beneath the beam of a Dynacote 300,000-volt linear electron accelerator at a speed and beam current so regulated as to produce a dose rate of 0.5 megarad.

These systems produced resinous materials of varying degrees of hardness in films from 0.5 to 20 mils thick having tacky surfaces.

EXAMPLE 14

The procedures of Examples 1 (B), 2 (B), 3, 4, 5 (B), and 6–11 were repeated except that instead of being exposed to ultraviolet light the samples were exposed to a combination of ultraviolet light and electron beam radiation in a variety of arrangements: ultraviolet light, then electron beam; electron beam, then ultraviolet light; ultraviolet light before and after electron beam; electron beam before and after ultraviolet radiation; and simultaneous electron beam and ultraviolet light radiation. The results were comparable.

What is claimed is:

1. A photopolymerizable compound comprising the product of the reaction of (1) a resin selected from the group consisting of polyamide, polyester oil-modified polyester, polyether, epoxy, phenolic, and polyurethane resins and (2) a polycarboxy-substituted benzophenone having the formula

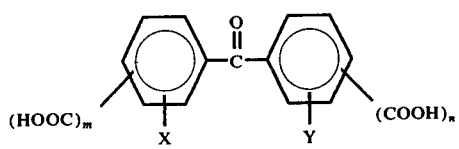

wherein $m$ and $n$ is each an integer from 0 to 3 and the sum of $m$ plus $n$ is in the range of 2 to 6; and X and Y is each 1 and 4 halogen atoms or dialkylamino groups having 1 to 4 carbon atoms; X and Y may be the same or different and either or both may be omitted.

2. The compound of claim 1 wherein the benzophenone moiety is about 5–50 weight percent of the product.

3. The compound of claim 1 wherein the benzophenone moiety is about 15–40 weight percent of the product.

4. A photopolymerizable printing ink comprising the compound of claim 1 and a colorant.

5. A photopolymerizable adhesive comprising the compound of claim 1.

6. A photopolymerizable coating composition comprising the compound of claim 1.

7. The compound of claim 1 wherein the polyester resin is an alkyd resin.

8. The compound of claim 1 wherein the polyester resin is an isocyanate-modified polyester.

* * * * *

UNITED STATES PATENT OFFICE
CERTIFICATE OF CORRECTION

PATENT NO. : 4,028,204
DATED : June 7, 1977
INVENTOR(S) : George Rosen, Daniel J. Carlick and Ralph H. Reiter It is certified that error appears in the above-identified patent and that said Letters Patent are hereby corrected as shown below:

Claim 1, column 11, line 1, change "and" to -- to --.

Signed and Sealed this thirtieth Day of August 1977

[SEAL]

Attest:

RUTH C. MASON
Attesting Officer

C. MARSHALL DANN
Commissioner of Patents and Trademarks